United States Patent
Nayak

(10) Patent No.: US 11,259,445 B2
(45) Date of Patent: Feb. 22, 2022

(54) COOLING MECHANISM FOR ELECTRIONIC COMPONENT MOUNTED ON A PRINTED WIRING BOARD

(71) Applicant: HAMILTON SUNDSTRAND CORPORATION, Charlotte, NC (US)

(72) Inventor: Hebri Vijayendra Nayak, Rockford, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 2 days.

(21) Appl. No.: 16/810,342

(22) Filed: Mar. 5, 2020

(65) Prior Publication Data

US 2021/0282299 A1    Sep. 9, 2021

(51) Int. Cl.
  *H05K 7/20* (2006.01)
  *H05K 1/14* (2006.01)
  *H05K 7/14* (2006.01)

(52) U.S. Cl.
  CPC ......... *H05K 7/20436* (2013.01); *H05K 1/141* (2013.01); *H05K 7/1402* (2013.01); *H05K 7/1427* (2013.01); *H05K 7/1461* (2013.01); *H05K 7/205* (2013.01); *H05K 7/209* (2013.01)

(58) Field of Classification Search
  CPC .......... H05K 1/18; H05K 1/181; H05K 1/189; H05K 7/1427; H05K 7/2039; H05K 1/147; H05K 2201/066; H05K 7/20436; H05K 7/205; H05K 7/1461; H05K 7/1402; H05K 7/209; H05K 1/141
  See application file for complete search history.

(56) References Cited

U.S. PATENT DOCUMENTS

| | | | |
|---|---|---|---|
| 3,997,819 A * | 12/1976 | Eggert | H05K 5/06 361/704 |
| 5,003,429 A * | 3/1991 | Baker | H05K 7/20509 165/185 |
| 5,339,221 A * | 8/1994 | Conroy-Wass | H05K 7/1424 361/784 |
| 6,285,556 B1 | 9/2001 | Guth et al. | |
| 6,392,891 B1 | 5/2002 | Tzlil et al. | |
| 6,760,220 B2 * | 7/2004 | Canter | H05K 7/1408 211/41.17 |

(Continued)

FOREIGN PATENT DOCUMENTS

| CN | 203746840 U | 7/2014 |
|---|---|---|
| CN | 110254247 A | 9/2019 |

(Continued)

OTHER PUBLICATIONS

Extended European Search Report for EP Application No. 21160962.3 dated Jul. 20, 2021, pp. 1-9.

*Primary Examiner* — Adam B Dravininkas
(74) *Attorney, Agent, or Firm* — Cantor Colburn LLP

(57) ABSTRACT

An electronic component module assembly includes a printed wiring board, and a stiffener assembly affixed to a first side of the printed wiring board. The stiffener assembly includes an outer stiffener secured to the printed wiring board, an inner stiffener removably located in an opening of the outer stiffener. The inner stiffener has one or more inner stiffener pockets formed therein, and one or more electronic components are installed in one or more inner stiffener pockets, and electrically connected to the printed wiring board.

20 Claims, 6 Drawing Sheets

(56) References Cited

U.S. PATENT DOCUMENTS

| | | | |
|---|---|---|---|
| 7,381,908 B1 | 6/2008 | Cantatore et al. | |
| 8,009,420 B1 | 8/2011 | Hill et al. | |
| 8,755,188 B2 | 6/2014 | Stella | |
| 8,942,005 B2 | 1/2015 | Geswender | |
| 8,987,777 B2 | 3/2015 | Hauenstein | |
| 9,781,867 B2 | 10/2017 | Yonak et al. | |
| 2003/0000080 A1* | 1/2003 | Colbert | H05K 7/1061 29/832 |
| 2006/0109631 A1 | 5/2006 | Marro et al. | |
| 2006/0133033 A1* | 6/2006 | Straub, Jr. | H05K 7/20563 361/690 |
| 2011/0141692 A1 | 6/2011 | Bult | |
| 2014/0048326 A1* | 2/2014 | Lin | H05K 1/0216 174/377 |
| 2018/0014426 A1 | 1/2018 | Kim | |
| 2019/0115269 A1 | 4/2019 | Pan et al. | |
| 2019/0380225 A1 | 12/2019 | Thompson et al. | |

FOREIGN PATENT DOCUMENTS

| | | |
|---|---|---|
| CN | 110266193 A | 9/2019 |
| CN | 110601615 A | 12/2019 |
| EP | 3206469 A1 | 8/2017 |

* cited by examiner

COOLING MECHANISM FOR ELECTRIONIC COMPONENT MOUNTED ON A PRINTED WIRING BOARD

BACKGROUND

Exemplary embodiments pertain to the art of electrical power systems, and in particular to assembly, disassembly and cooling of such electrical power systems.

Electrical power systems include, for example, one or more half-bridge modules secured to a printed wiring board (PWB). A half-bridge module is a package of silicon carbide field effect transistors (SiCFETs) and diodes. The thermal management of a half-bridge module presents a unique challenge. One of the two larger faces of the half-bridge module is fastened to the PWB to establish electrical connection. But, the heat dissipation from the half-bridge module occurs through a face that is opposite to the face that is in contact with the PWB. The heat dissipation of such a structure occurs through the faces of the four half-bridge modules, opposite the surface of the half-bridge module that abuts and is secured to the PWB.

As such electrical power systems, such as electrical power systems for space applications, become increasingly power dense, there is a need for solutions to adequately cool the components of the electrical power system. Further, it is desired to improve modularity of such systems, thereby making the systems easier to assemble and easier to disassemble or replace components.

BRIEF DESCRIPTION

In one embodiment, an electronic component module assembly includes a printed wiring board, and a stiffener assembly affixed to a first side of the printed wiring board. The stiffener assembly includes an outer stiffener secured to the printed wiring board, an inner stiffener removably located in an opening of the outer stiffener. The inner stiffener has one or more inner stiffener pockets formed therein, and one or more electronic components are installed in one or more inner stiffener pockets, and electrically connected to the printed wiring board.

Additionally or alternatively, in this or other embodiments the inner stiffener includes a tapered inner stiffener end and the outer stiffener includes a complimentary tapered inner stiffener end. The tapered inner stiffener end and the tapered outer stiffener end define a guide for location and installation of the inner stiffener to the outer stiffener.

Additionally or alternatively, in this or other embodiments the inner stiffener and the outer stiffener are formed from an aluminum material.

Additionally or alternatively, in this or other embodiments one or more wedge lock rails are located at the outer stiffener and the inner stiffener, and a wedge lock is located at each wedge lock rail of the one or more wedge lock rails, securing the inner stiffener at the outer stiffener.

Additionally or alternatively, in this or other embodiments a first cover is secured to the stiffener assembly, at an opposite side of the stiffener from the printed wiring board.

Additionally or alternatively, in this or other embodiments a second cover is secured to the printed wiring board, at an opposite side of the printed wiring board from the stiffener assembly.

Additionally or alternatively, in this or other embodiments the first cover and the second cover are formed from an aluminum material.

Additionally or alternatively, in this or other embodiments the top cover is in thermal contact with one or more stiffener ribs of the stiffener assembly.

Additionally or alternatively, in this or other embodiments the outer stiffener is secured to the printed wiring board via an adhesive.

Additionally or alternatively, in this or other embodiments the printed wiring board is secured to the outer stiffener at a first side of the outer stiffener and the inner stiffener is installed to a second side of the outer stiffener opposite of the first side of the outer stiffener.

Additionally or alternatively, in this or other embodiments the one or more electronic components include one or more of half bridge modules, MOSFETs, diodes, or transistors.

In another embodiment a method of assembly of an electronic component module assembly includes installing one or more electronic components at a first inner stiffener side of an inner stiffener, and installing the inner stiffener into an opening defined in an outer stiffener, the inner stiffener installed to a first outer stiffener side of the outer stiffener. A printed wiring board is secured to a second outer stiffener side of the outer stiffener opposite the first outer stiffener side. The securing brings the one or more electronic components into electrical contact with the printed wiring board.

Additionally or alternatively, in this or other embodiments the inner stiffener includes a tapered inner stiffener end, and the outer stiffener includes a complimentary tapered inner stiffener end, the tapered inner stiffener end and the tapered outer stiffener end defining a guide for location and installation of the inner stiffener to the outer stiffener.

Additionally or alternatively, in this or other embodiments a wedge lock is installed at one or more wedge lock rails located at the outer stiffener and the inner stiffener, thereby securing the inner stiffener to the outer stiffener.

Additionally or alternatively, in this or other embodiments a first cover is secured to the inner stiffener at a second inner stiffener side of an inner stiffener opposite the first inner stiffener side.

Additionally or alternatively, in this or other embodiments a second cover is secured to the printed wiring board, at an opposite side of the printed wiring board from the outer stiffener.

Additionally or alternatively, in this or other embodiments the top cover is in thermal contact with one or more stiffener ribs of the inner stiffener.

Additionally or alternatively, in this or other embodiments the outer stiffener is secured to the printed wiring board via an adhesive.

Additionally or alternatively, in this or other embodiments the one or more electronic components include one or more of half bridge modules, MOSFETs, diodes, or transistors.

Additionally or alternatively, in this or other embodiments the inner stiffener and the outer stiffener are formed from an aluminum material.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
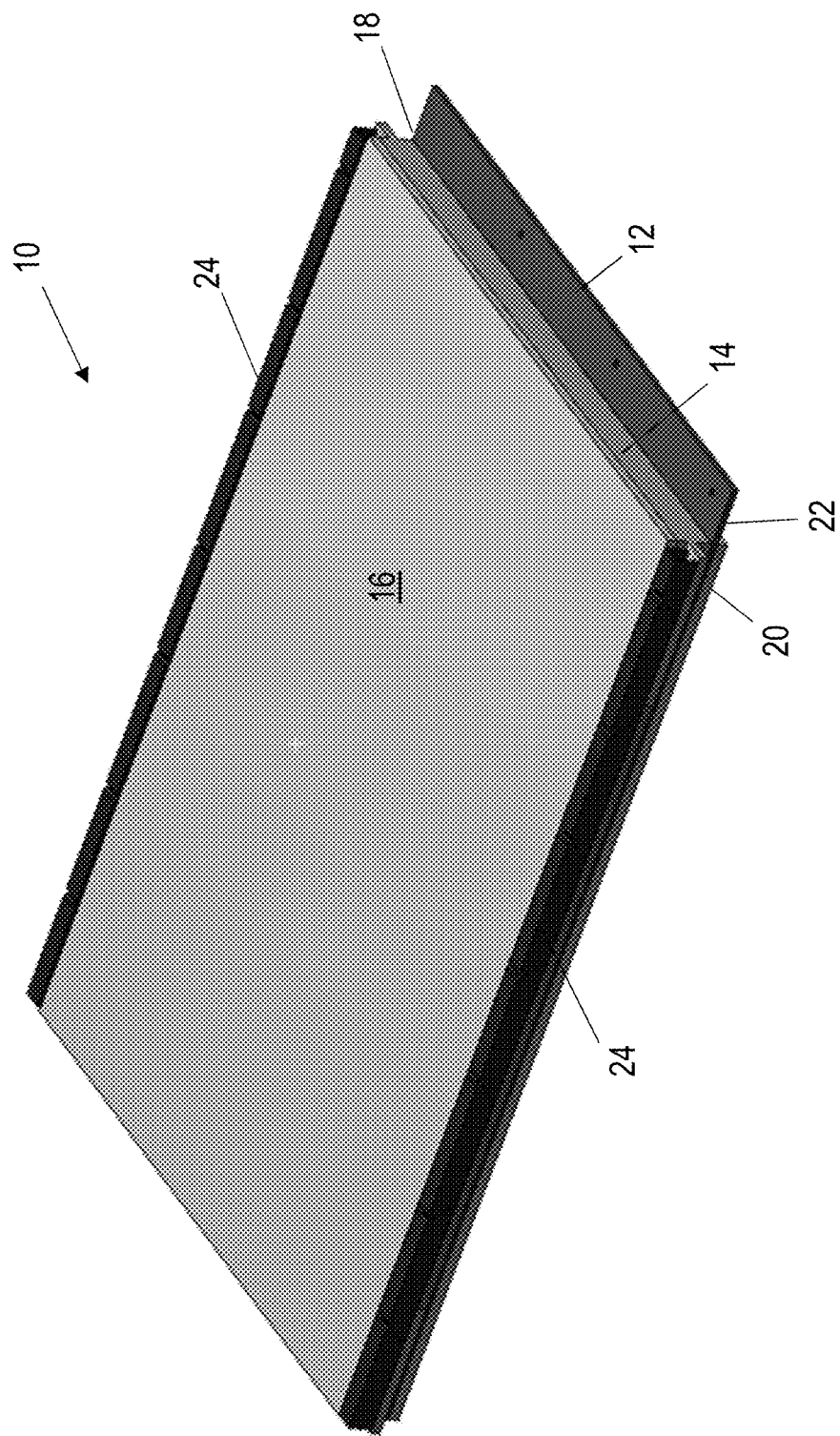
FIG. 1 is a perspective view of an embodiment of an electronic component assembly module.

Referring now to FIG. 1, shown is a perspective view of an electronic component assembly module 10. The assembly module 10 includes a printed wiring board (PWB) 12, and stiffener assembly 14 secured to the PWB 12, a first cover 16 disposed at a first side 18 of the PWB 12 over the stiffener assembly 14, and a second cover 20 disposed at a second side 22 of the PWB 12 opposite the first side 18. Wedge locks 24, or other securing mechanism are utilized to secure the assembly module 10 into its completed form in an electronic box.

Figure 2:
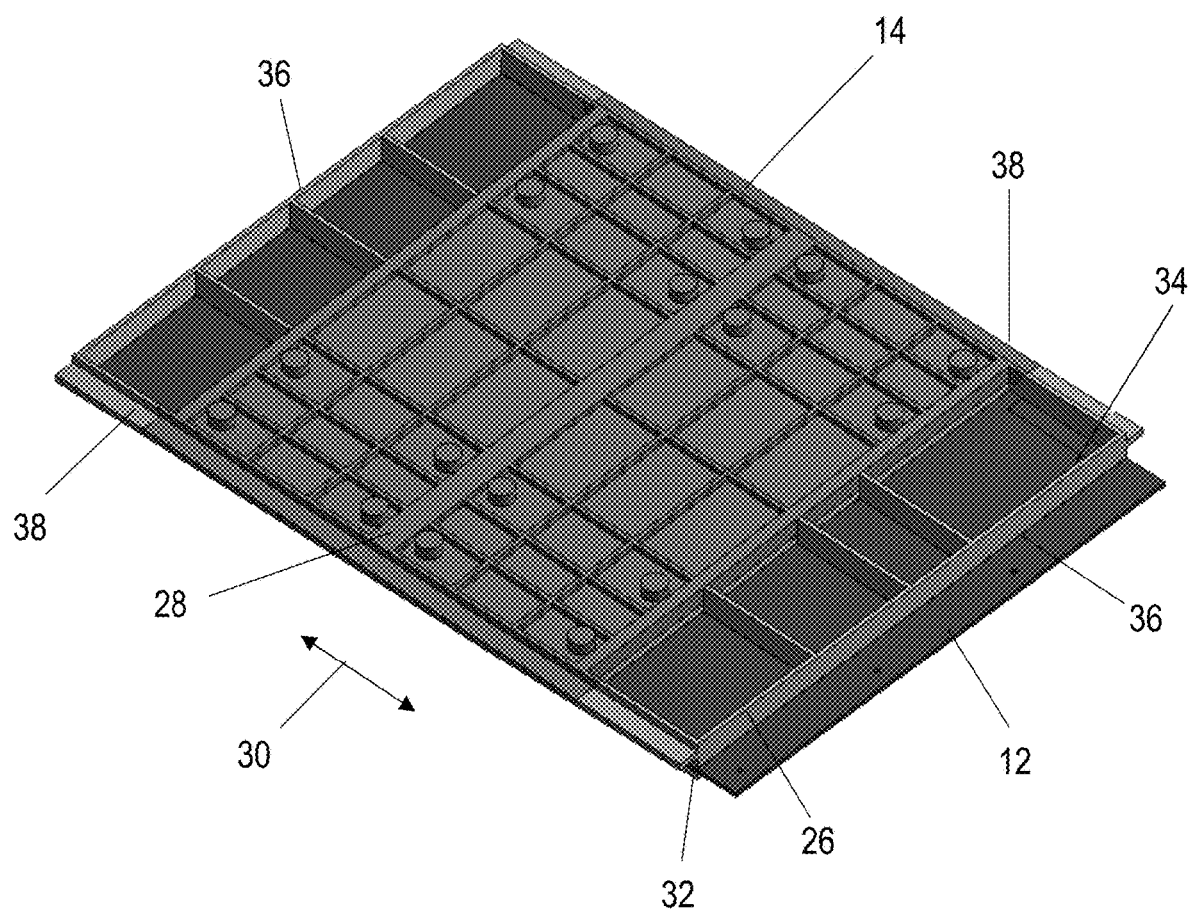
FIG. 2 is an illustration of an embodiment of a stiffener assembly of an assembly module.
Figure 3:
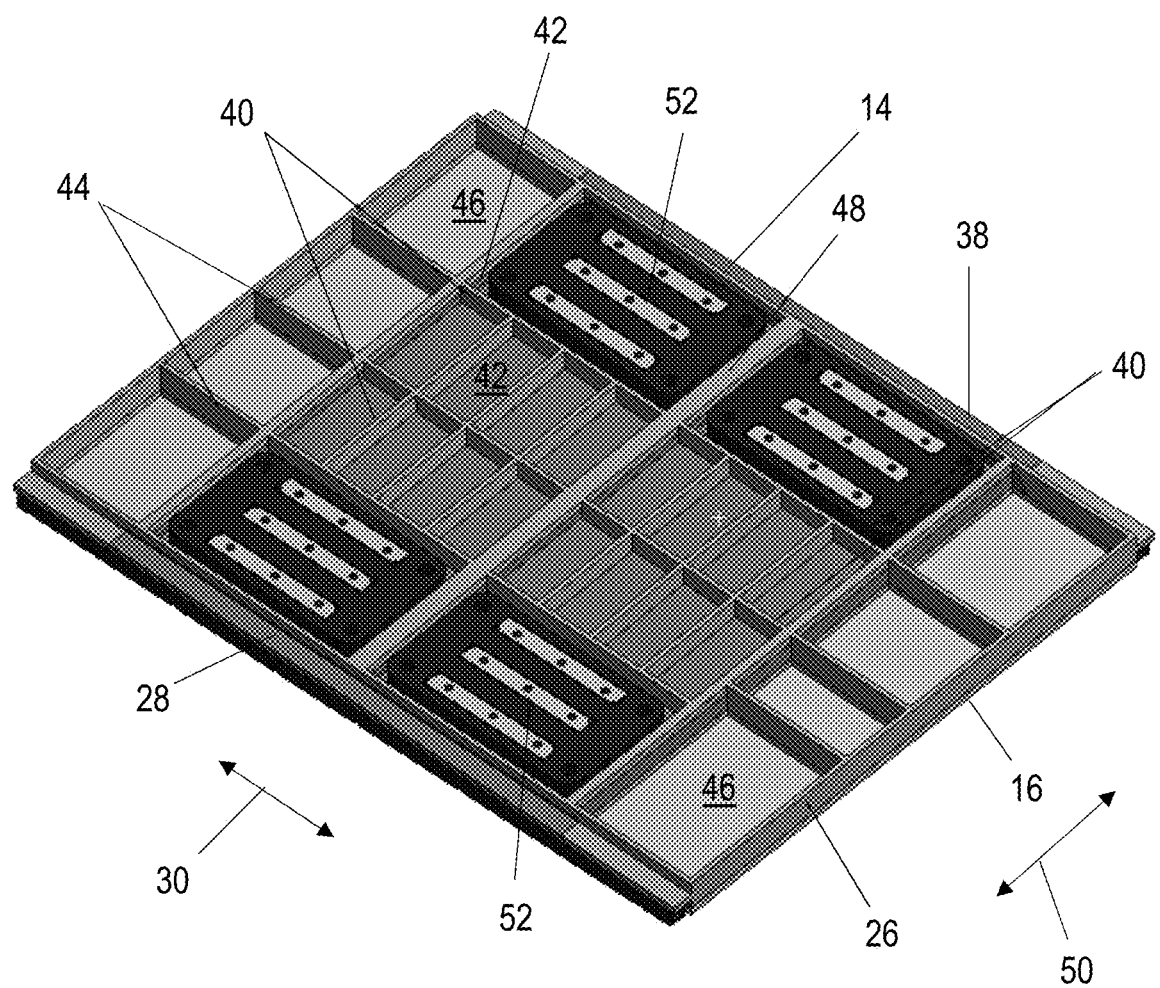
FIG. 3 is another illustration of an embodiment of a stiffener assembly of an assembly module.

Referring now to FIGS. 2 and 3, shown are partially disassembled views of the assembly module 10. FIG. 2 illustrates the stiffener assembly 14 assembled to the PWB 12. The stiffener assembly 14 includes an outer stiffener 26 and an inner stiffener 28 installed into the outer stiffener 26. The outer stiffener 26 and the inner stiffener 28 are formed from highly thermally conductive materials, such as aluminum or an aluminum alloy. As shown, the inner stiffener 28 is located inside the outer stiffener 26 in a lengthwise direction 30 of the stiffener assembly 14. The stiffener assembly 14 includes a bottom side 32 and a top side 34 opposite the bottom side 32, with the an outer stiffener portion 36 of the bottom side 32 bonded to the PWB 12 by, for example, an adhesive material between the outer stiffener portion 36 and the PWB 12. The inner stiffener 28 is not in bonded contact with the PWB 12 and is easily removable from the outer stiffener 26 and from the PWB 12. The inner stiffener 28 is secured to the outer stiffener 26 via the wedge locks 24. The inner stiffener 28 and the outer stiffener 26 include wedge lock rails 38 extending in the lengthwise direction 30 onto which the wedge locks 24 are installed.

Referring now to FIG. 3, shown is a view of the stiffener assembly 14 removed from the PWB 12, with the first cover 16 installed to the top side 34 of the stiffener assembly 14. As can be seen in FIG. 3 the stiffener assembly 14 includes a plurality of inner stiffener ribs 40 in the inner stiffener 28, which define a plurality of inner stiffener pockets 42 therebetween. Similarly, the outer stiffener 26 includes a plurality of outer stiffener ribs 44 defining a plurality of outer stiffener pockets 46 therebetween. The inner stiffener 28 may include a center rail 48 extending across the inner stiffener 28 in a widthwise direction 50 perpendicular to the lengthwise direction. In some embodiments, the inner stiffener 28 is symmetrical about the center rail 48. Further, in some embodiments, the center rail 48 has a larger cross-sectional area than the inner stiffener ribs 40.

One or more electronic components are installed in the plurality of inner stiffener pockets 42 such that when the assembly module 10 is completed, the one or more electronic components are electrically connected to the PWB 12. For example, in the embodiment of FIG. 3, the electronic components are four half-bridge modules 52. The half bridge modules 52 are each secured in an inner stiffener pocket 42 with, for example one or more screws or other fasteners. While four half-bridge modules 52 are shown installed to the inner stiffener pockets 42, one skilled in the design of a printed wiring board will readily appreciate that additional electronic components, and/or components other than half-bridge assemblies 52 may be installed to the inner stiffener pockets 42. Examples of such other electronic components include MOSFETs, diodes, transistors or the like.

Figure 4:
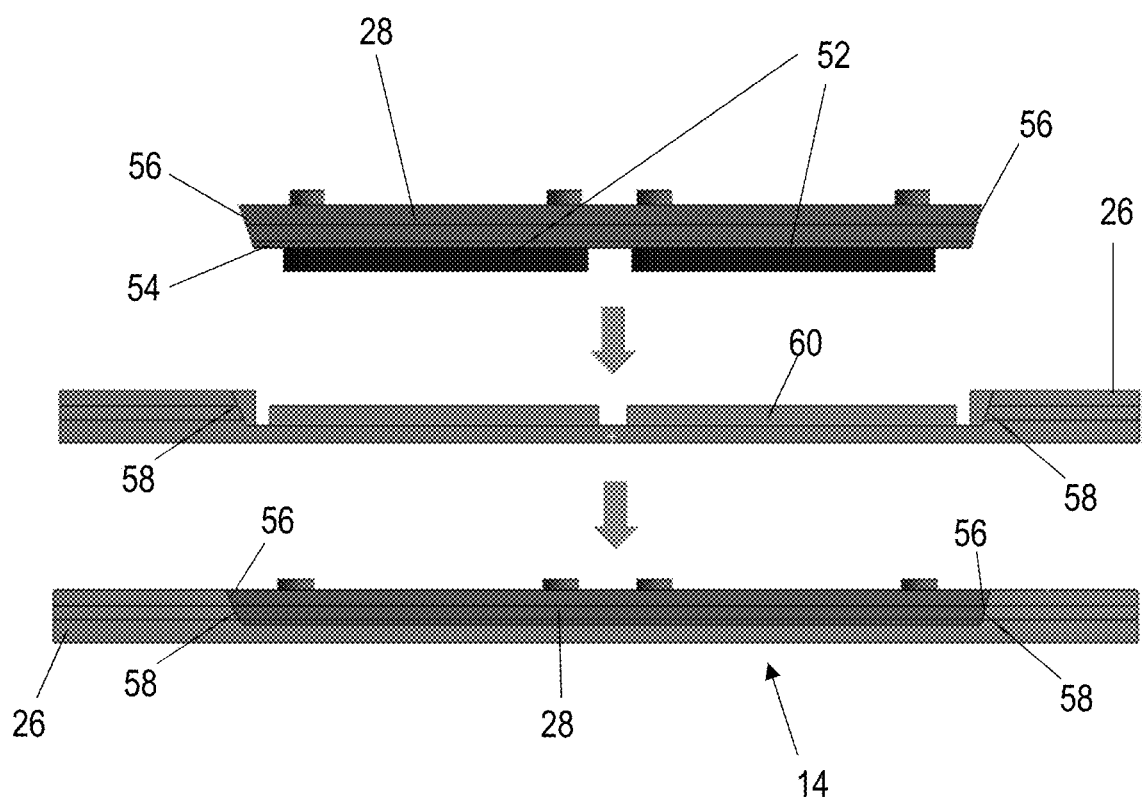
FIG. 4 is an illustration of a process of assembly of an embodiment of a stiffener assembly.

The assembly module 10 is configured for ease of assembly of the half bridge modules 52 into the assembly module 10 and also ease of replacement of the half bridge modules 52 via installation and removal of the inner stiffener 28. To assemble the assembly module 10, referring to FIG. 4, the half bridge modules 52 are installed at an inner stiffener bottom side 54. The inner stiffener 28 is then installed to the outer stiffener 26. The inner stiffener 28 includes a tapered inner stiffener end 56, and the outer stiffener 26 includes a complimentary tapered outer stiffener end 58. The tapered outer stiffener end 58 defines an opening 62 into which the inner stiffener 28 is installed, with the tapered outer stiffener end 58 and the tapered inner stiffener end 56 acting as a guide for alignment and installation of the inner stiffener 28 into the outer stiffener 26.

Figure 5:
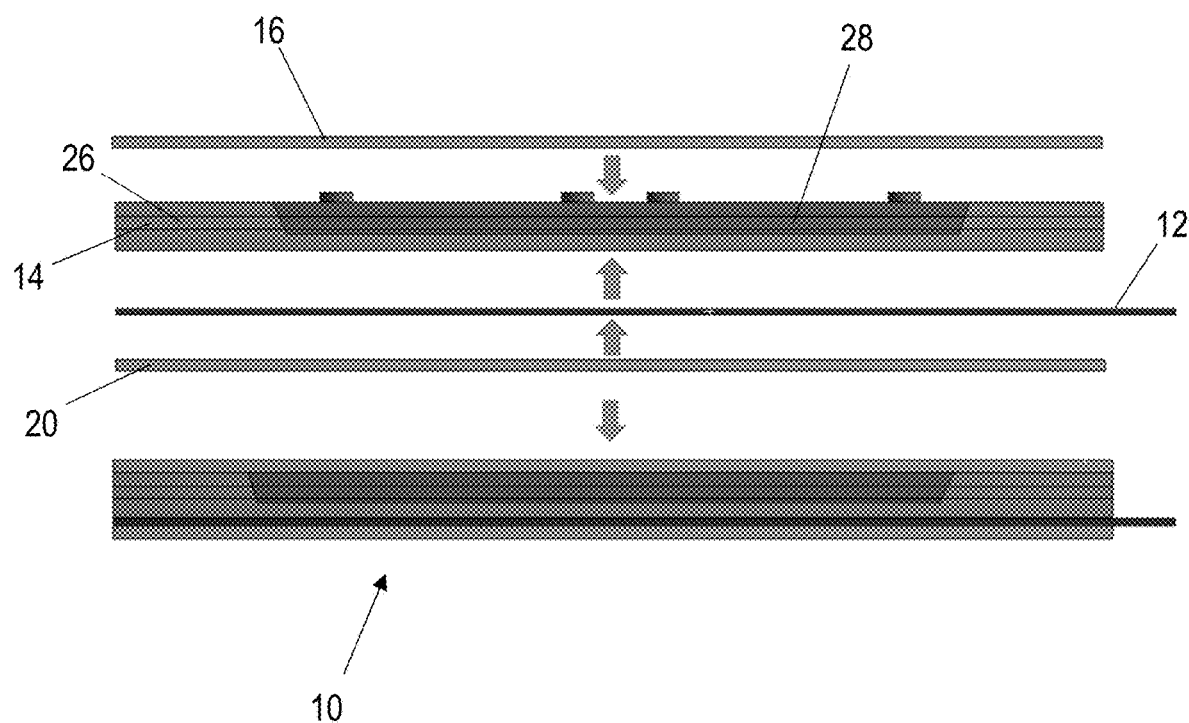
FIG. 5 is an illustration of a process of assembly of an embodiment of an assembly module.

Referring now to FIG. 5, after the inner stiffener 28 is installed to the outer stiffener 26 to form the stiffener assembly 14, the stiffener assembly 14 is installed to the PWB 12, with the outer stiffener 26 secured to the PWB 12 via an adhesive to define a bonded, inseparable joint between the PWB 12 and the outer stiffener 26. Each half bridge module 52 is electrically connected to the PWB 12 via a plurality of fasteners. The first cover 16 and the second cover 20 are then installed to the stiffener assembly 14 and PWB 12. Wedge locks 24 are installed at the wedge lock rails 38 to complete the assembly module 10.

Figure 6:
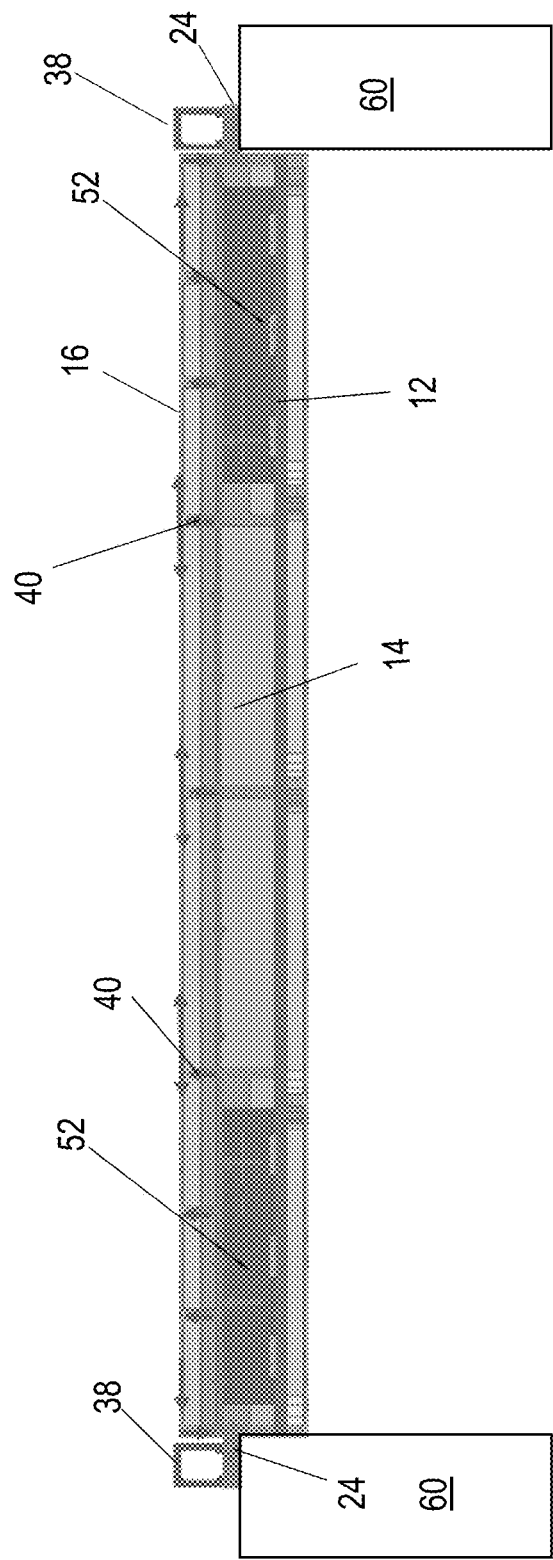
FIG. 6 is an illustration of thermal energy conduction in an embodiment of an assembly module.

Referring now to FIG. 6, illustrated is a cross-sectional view of the assembly module 10 illustrating the conduction heat transfer in the assembly module 10 to dissipate thermal energy from the half bridge modules 52. The half bridge modules 52 generate heat during operation, and the heat is conducted in the upward direction from the half bridge modules 52 into the inner stiffener 28. From the half bridge modules 52, the thermal energy is conducted into the inner stiffener 28 and into the outer stiffener 26 via, for example, the inner stiffener ribs 40 and into the outer stiffener 26 via the outer stiffener ribs 44. The thermal energy is conducted toward and into the wedge lock rails 38, where the thermal energy is removed from the assembly module 10 via a heat removal device 60 such as, for example, a cold plate or a fan. Additionally, a small part of the thermal energy from the half bridge modules is conducted through the first cover 16 toward the wedge lock rails 38 for additional heat removal capability from the half bridge modules 52.

The assembly module 10 and stiffener assembly 14 described herein provides a unique thermal management solution for the half bridge modules 52. Further, the structure provides for improved ease of assembly and improved ease of disassembly of the half bridge modules 52 in the assembly module 10, thus improving ease of repair and/or replacement of the half bridge modules 52. Further, the assembly module 10 may be utilized in a myriad of applications, such as deep space, ground-based or underwater-based applications.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. An electronic component module assembly, comprising:
   a printed wiring board; and
   a stiffener assembly affixed to a first side of the printed wiring board, the stiffener assembly including:
      an outer stiffener having a first outer stiffener side secured to the printed wiring board;
      an inner stiffener removably disposed in an opening of the outer stiffener at a second outer stiffener side opposite the first outer stiffener side, the inner stiffener having one or more inner stiffener pockets formed therein; and
      one or more electronic components installed in one or more inner stiffener pockets, and electrically connected to the printed wiring board.

2. The electronic component module assembly of claim 1, wherein:
   the inner stiffener includes a tapered inner stiffener end; and
   the outer stiffener includes a complimentary tapered inner stiffener end, the tapered inner stiffener end and the tapered outer stiffener end defining a guide for location and installation of the inner stiffener to the outer stiffener.

3. The electronic component module assembly of claim 1, wherein the inner stiffener and the outer stiffener are formed from an aluminum material.

4. The electronic component module assembly of claim 1, further comprising:
   one or more wedge lock rails disposed at the outer stiffener and the inner stiffener; and
   a wedge lock disposed at each wedge lock rail of the one or more wedge lock rails, securing the inner stiffener at the outer stiffener.

5. The electronic component module assembly of claim 1, further comprising a first cover secured to the stiffener assembly, at an opposite side of the stiffener from the printed wiring board.

6. The electronic component module assembly of claim 5, further comprising a second cover secured to the printed wiring board, at an opposite side of the printed wiring board from the stiffener assembly.

7. The electronic component module assembly of claim 6, wherein the first cover and the second cover are formed from an aluminum material.

8. The electronic component module assembly of claim 5, wherein the first cover is in thermal contact with one or more stiffener ribs of the stiffener assembly.

9. The electronic component module assembly of claim 1, wherein the outer stiffener is secured to the printed wiring board via an adhesive.

10. The electronic component module assembly of claim 1, wherein the printed wiring board is secured to the outer stiffener at a first side of the outer stiffener and the inner stiffener is installed to a second side of the outer stiffener opposite of the first side of the outer stiffener.

11. The electronic component module assembly of claim 1, wherein the one or more electronic components include one or more of half bridge modules, MOSFETs, diodes, or transistors.

12. A method of assembly of an electronic component module assembly, comprising:
   installing one or more electronic components at a first inner stiffener side of an inner stiffener;
   installing the inner stiffener into an opening defined in an outer stiffener, the inner stiffener installed to a first outer stiffener side of the outer stiffener; and
   securing a printed wiring board to a second outer stiffener side of the outer stiffener opposite the first outer stiffener side, the securing bringing the one or more electronic components into electrical contact with the printed wiring board.

13. The method of claim 12, wherein:
   the inner stiffener includes a tapered inner stiffener end; and
   the outer stiffener includes a complimentary tapered inner stiffener end, the tapered inner stiffener end and the tapered outer stiffener end defining a guide for location and installation of the inner stiffener to the outer stiffener.

14. The method of claim 12, further comprising installing a wedge lock at one or more wedge lock rails disposed at the outer stiffener and the inner stiffener, thereby securing the inner stiffener to the outer stiffener.

15. The method of claim 12, further comprising securing a first cover to the inner stiffener at a second inner stiffener side of an inner stiffener opposite the first inner stiffener side.

16. The method of claim 15, further comprising securing a second cover to the printed wiring board, at an opposite side of the printed wiring board from the outer stiffener.

17. The method of claim 15, wherein the first cover is in thermal contact with one or more stiffener ribs of the inner stiffener.

18. The method of claim 12, wherein the outer stiffener is secured to the printed wiring board via an adhesive.

19. The method of claim 12, wherein the one or more electronic components include one or more of half bridge modules, MOSFETs, diodes, or transistors.

20. The method of claim 12, wherein the inner stiffener and the outer stiffener are formed from an aluminum material.

* * * * *